United States Patent
Mochizuki et al.

(10) Patent No.: US 7,498,726 B2
(45) Date of Patent: Mar. 3, 2009

(54) MULTILAYER PIEZOELECTRIC ELEMENT

(75) Inventors: Kazuo Mochizuki, Tokyo (JP); Satoshi Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/976,176

(22) Filed: Oct. 22, 2007

(65) Prior Publication Data

US 2008/0116768 A1 May 22, 2008

(30) Foreign Application Priority Data

Nov. 21, 2006 (JP) ............................. 2006-314654

(51) Int. Cl.
*H01L 41/047* (2006.01)
(52) U.S. Cl. .................. 310/364; 310/363; 310/365; 310/366
(58) Field of Classification Search .......... 310/363–366
See application file for complete search history.

(56) References Cited

U.S. PATENT DOCUMENTS 5,233,260 A * 8/1993 Harada et al. ............... 310/364

2008/0136293 A1 * 6/2008 Mochizuki et al. .......... 310/358

FOREIGN PATENT DOCUMENTS

JP A-05-243635 9/1993

* cited by examiner

*Primary Examiner*—Jaydi SanMartin
(74) *Attorney, Agent, or Firm*—Oliff & Berridge, PLC

(57) ABSTRACT

A multilayer piezoelectric element has a laminate body in which a plurality of piezoelectric bodies and a plurality of internal electrodes are alternately laminated and sintered. The plurality of internal electrodes comprise a first electrode and a second electrode. The laminate body has an active portion in which the first electrode and the second electrode are arranged to overlap in a laminate direction of the laminate body, and inactive portions in which the first electrode and the second electrode are arranged not to overlap in the laminate direction of the laminate body. The inactive portions are provided on both sides of the active portion. The inactive portions are provided with a metal oxide layer made of a material having a melting point higher than a sintering temperature of the piezoelectric bodies and being soluble in the piezoelectric bodies.

5 Claims, 8 Drawing Sheets

MULTILAYER PIEZOELECTRIC ELEMENT

BACKGROUND OF THE INVENTION

1. Field of the Invention

The present invention relates to a multilayer piezoelectric element used in a fuel injection device or the like.

2. Related Background Art

In general, a multilayer piezoelectric element has a laminate body in which piezoelectric bodies and internal electrodes are alternately laminated, and external electrodes provided on side faces of this laminate body and connected to the internal electrodes. When a voltage is applied to the external electrodes, an overlap region (active region) between the internal electrodes of different polarities is deformed in the piezoelectric bodies. During driving of such an element, considerable stress concentration occurs at a border between the active region and an inactive region in the piezoelectric bodies, so as to facilitate production of cracks or the like extending in the laminate direction of the laminate body. For this reason, there are many proposals on multilayer piezoelectric elements with a stress relaxing layer in the inactive region of the laminate body, in recent years. For example, Japanese Patent Application Laid-Open No. 5-243635 describes a metal oxide layer formed as the stress relaxing layer by printing an alumina paste.

SUMMARY OF THE INVENTION

Since in the multilayer piezoelectric element of the above-described conventional technology the metal oxide layer (alumina layer) is formed in the inactive region of the laminate body, cracks or the like extending in the laminate direction of the laminate body are less likely to occur during the driving. However, there arises a new problem that a sufficient displacement is not achieved against an electric field applied during the driving and this leads to degradation of the piezoelectric property.

An object of the present invention is to provide a multilayer piezoelectric element capable of preventing the occurrence of the cracks or the like extending in the laminate direction of the laminate body, while ensuring a desired piezoelectric property.

The inventors conducted elaborate research on materials for making up the metal oxide layer for stress relaxation. As a result of the research, the inventors found that, for example, when the piezoelectric bodies were made of a piezoelectric ceramic material whose principal ingredient was PZT (lead zirconate titanate), and when a material to separate out in grain boundaries without making a solid solution with PZT, e.g., like $Al_2O_3$ was used for the metal oxide layer for stress relaxation, the element failed to be sufficiently displaced against the electric field applied during the driving. A conceivable reason is as follows: $Al_2O_3$ or the like becomes a grain boundary component, and thus impedes growth of particles of PZT, to increase the number of grain boundaries per unit thickness in the piezoelectric bodies, and this results in causing thermal loss in the grain boundaries when the driving electric field is applied to the element. The present invention has been accomplished on the basis of such finding.

The present invention provides a multilayer piezoelectric element comprising a laminate body in which a plurality of piezoelectric bodies and a plurality of internal electrodes are alternately laminated and sintered, wherein the plurality of internal electrodes comprise a first electrode and a second electrode, wherein the laminate body has: an active portion in which the first electrode and the second electrode are arranged to overlap in a laminate direction of the laminate body; and inactive portions which are provided on both sides of the active portion and in which the first electrode and the second electrode are arranged not to overlap in the laminate direction of the laminate body, and wherein the inactive portions are provided with a metal oxide layer formed of a material having a melting point higher than a sintering temperature of the piezoelectric bodies and being soluble in the piezoelectric bodies.

In the multilayer piezoelectric element of the present invention, the inactive portions of the laminate body are provided with the metal oxide layer. This metal oxide layer is formed of the material having the melting point higher than the sintering temperature of the piezoelectric bodies. For this reason, the metal oxide layer is not fully sintered in comparison with the piezoelectric bodies, during firing of the laminate body in a production process of the element, and therefore the metal oxide layer becomes a layer with low bond strength to the piezoelectric bodies. Therefore, when a voltage is applied between the first electrode and the second electrode, an electric field is produced between them to displace the piezoelectric bodies in the active portion of the laminate body in the laminate direction of the laminate body and cause concentration of stress on the inactive portions of the laminate body, but the foregoing metal oxide layer effectively relaxes the stress on the inactive portions. This successfully prevents the occurrence of the cracks or the like extending in the laminate direction of the laminate body.

The metal oxide layer is formed of the material soluble in the piezoelectric bodies. For this reason, a component of the metal oxide layer becomes less likely to separate out in the grain boundaries of the piezoelectric bodies during the firing of the laminate body, so as to suppress increase in the number of grain boundaries per unit thickness in the piezoelectric bodies. It is considered that this suppresses the thermal loss occurring in the grain boundaries with application of the electric field between the first electrode and the second electrode. In the multilayer piezoelectric element of the present invention, therefore, a sufficient displacement is achieved against the electric field applied during the driving, and a desired piezoelectric property is ensured. Since the number of grain boundaries per unit thickness is reduced in the piezoelectric bodies, the cracks or the like extending in the laminate direction of the laminate body become more unlikely to occur.

Preferably, the piezoelectric bodies are formed of a piezoelectric material whose principal ingredient is lead zirconate titanate, and the metal oxide layer is formed of a material containing at least one of $ZrO_2$, $MgO$, $Nb_2O_5$, $Ta_2O_5$, $CeO_2$, and $Y_2O_3$. Lead zirconate titanate is believed to be a preferred material for the piezoelectric bodies. Furthermore, $ZrO_2$, $MgO$, $Nb_2O_5$, $Ta_2O_5$, $CeO_2$, and $Y_2O_3$ are materials which have the melting point higher than the sintering temperature of lead zirconate titanate and which are soluble in lead zirconate titanate. Therefore, when such materials are used for the metal oxide layer, it is feasible to reliably form the metal oxide layer suitable for stress relaxation.

Preferably, the metal oxide layer is formed in the same layer as the internal electrode. In this case, when the element is produced so that the thickness of the metal oxide layer becomes approximately equal to the thickness of the internal electrode, it is feasible to reduce influence of strain in the laminate body due to a level difference between the metal oxide layer and the internal electrode during firing of the laminate body.

Preferably, the metal oxide layer is formed so as to penetrate the active portion in a layer between the first electrode and the second electrode. In this case, even if a crack or the like is made in the active portion of the laminate body, this crack or the like tends to extend along the metal oxide layer and in a direction perpendicular to the laminate direction of the laminate body. This makes it surer to prevent the occurrence of the cracks or the like extending in the laminate direction of the laminate body.

The present invention successfully prevents the occurrence of cracks or the like extending in the laminate direction of the laminate body, while ensuring the desired piezoelectric property. This permits us to obtain the high-performance multilayer piezoelectric element.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the multilayer piezoelectric element according to the present invention will be described below in detail with reference to the drawings.

Figure 1:
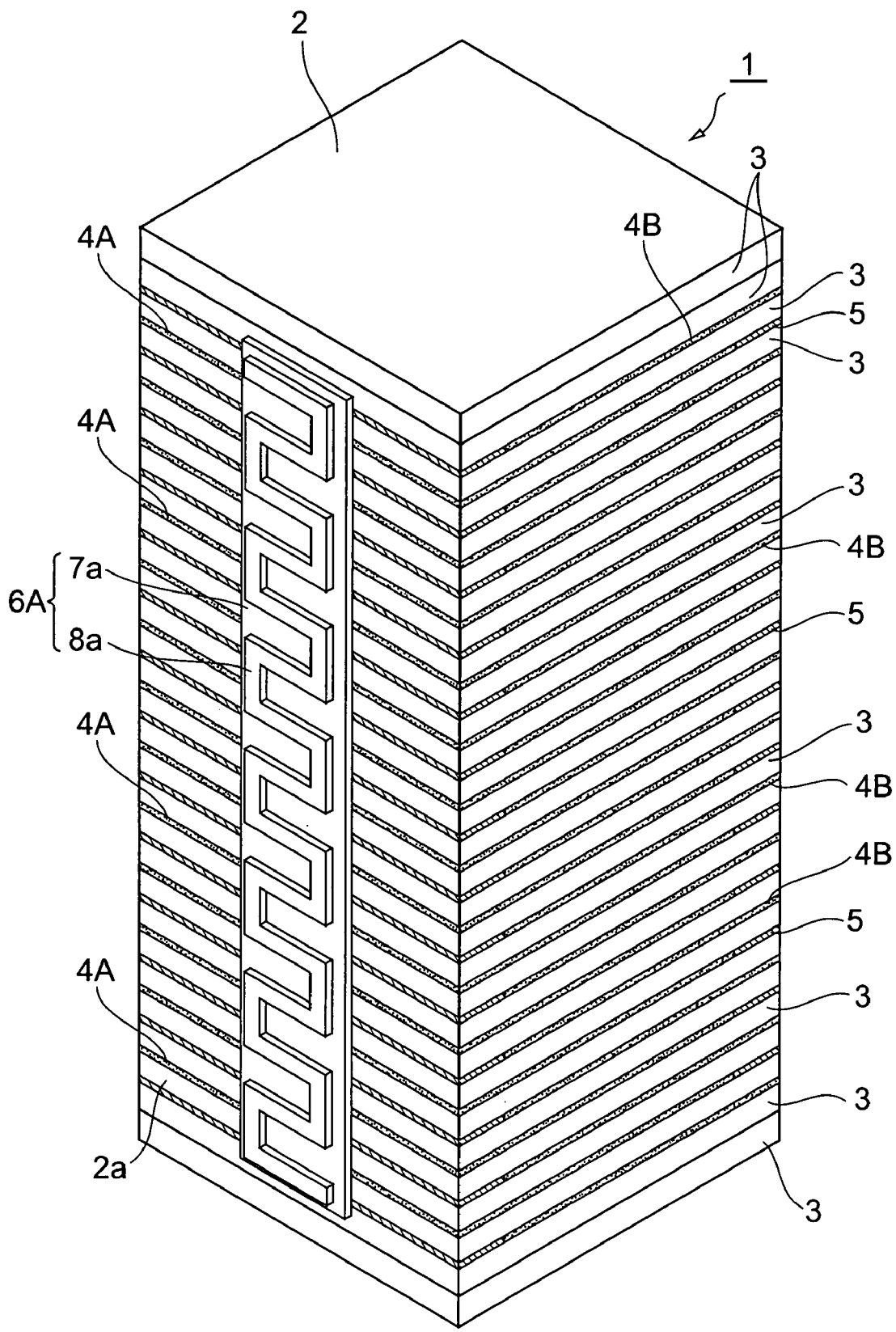
FIG. 1 is a perspective view showing a multilayer piezoelectric element according to the first embodiment.
Figure 2:
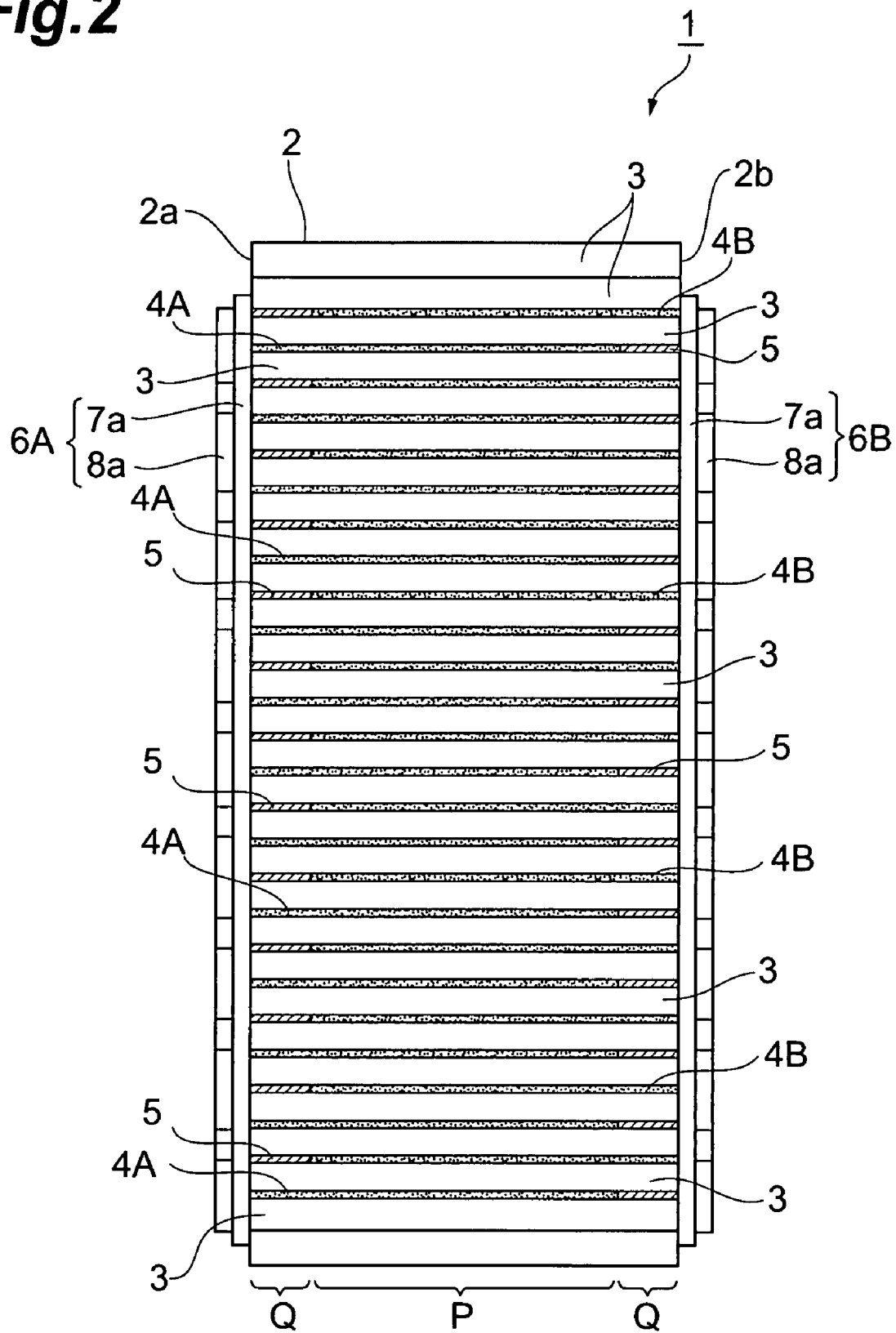
FIG. 2 is a side view of the multilayer piezoelectric element shown in FIG. 1.
Figure 3:
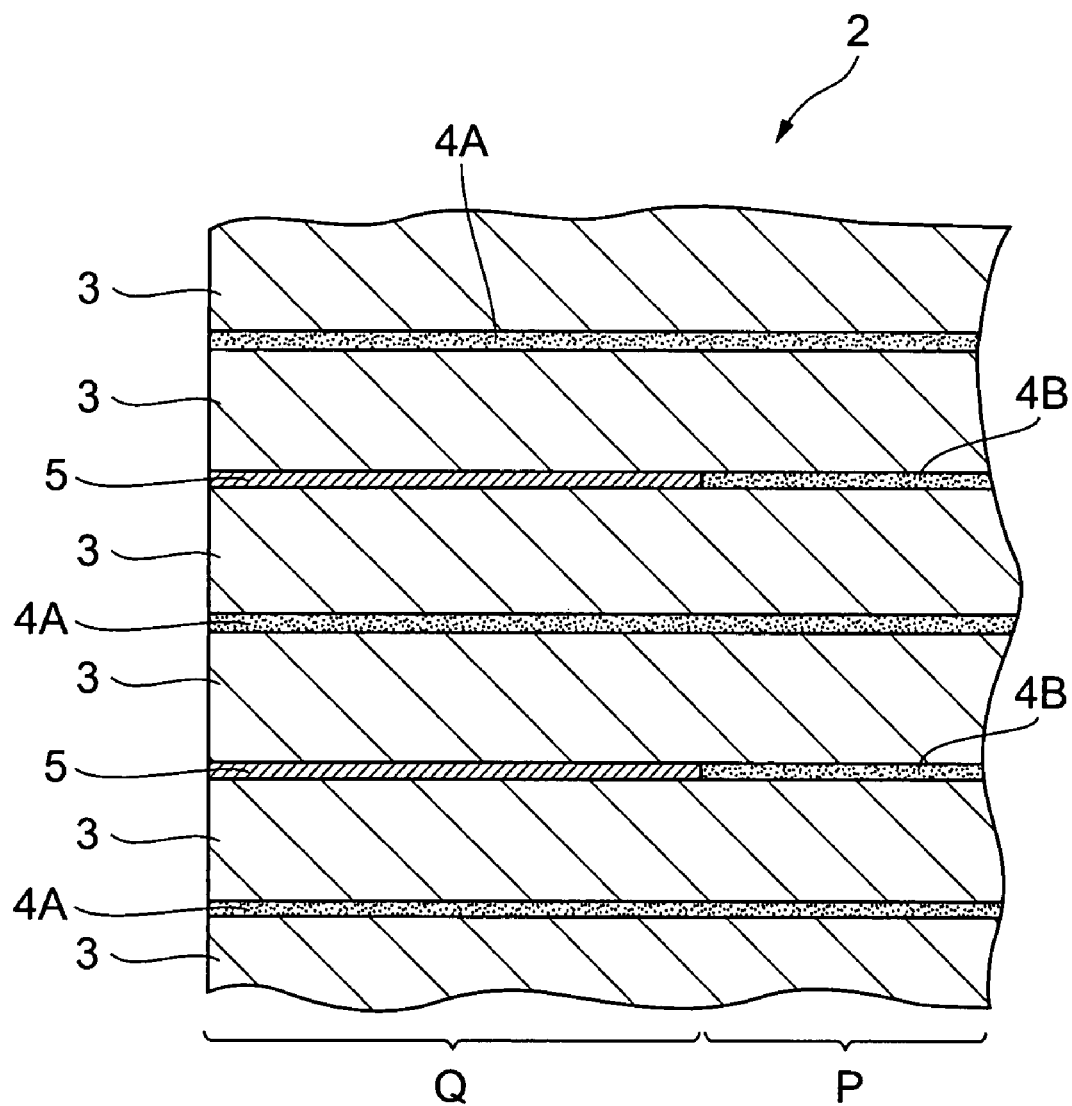
FIG. 3 is a partly enlarged sectional view showing a layer structure of a laminate body shown in FIG. 1.

FIG. 1 is a perspective view showing the multilayer piezoelectric element according to the first embodiment, FIG. 2 a side view of the multilayer piezoelectric element shown in FIG. 1, and FIG. 3 a partly enlarged sectional view showing a layer structure of the multilayer piezoelectric element shown in FIG. 1. In each drawing, the multilayer piezoelectric element 1 of the present embodiment is one used, for example, in a fuel injection device of an internal combustion engine mounted on an automobile.

The multilayer piezoelectric element 1 has a laminate body 2 of quadrangular prism shape. The laminate body 2 is formed by laminating a plurality of piezoelectric bodies 3 and a plurality of internal electrodes 4A, 4B in a predetermined order and sintering them. The dimensions of the laminate body 2 are, for example, width 10 mm×depth 10 mm×height 35 mm.

The piezoelectric bodies 3 are made, for example, of a piezoelectric ceramic material whose main ingredient is PZT (lead zirconate titanate). The thickness of the piezoelectric bodies 3 is, for example, approximately 80-100 μm per layer. The composition of PZT used herein is, for example, as follows.

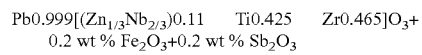

$Pb0.999[(Zn_{1/3}Nb_{2/3})0.11$ $Ti0.425$ $Zr0.465]O_3+$
0.2 wt% $Fe_2O_3$+0.2 wt% $Sb_2O_3$

The powder characteristics of PZT employed herein are, for example, the BET specific surface area of about 2.5 m²/g and the average particle size of about 0.6 μm. The sintering temperature of such PZT is about 950° C. The melting point of PZT-based materials is about 1300° C.

The internal electrodes 4A, 4B are made, for example, of an electroconductive material whose principal ingredients are Ag and Pd. The internal electrodes 4A, 4B are alternately laminated with a piezoelectric body 3 in between. One end of each internal electrode 4A is exposed in one side face 2a of the laminate body 2 and the other end of the internal electrode 4A is located inside the other side face 2b of the laminate body 2. One end of each internal electrode 4B is exposed in the side face 2b of the laminate body 2 and the other end of the internal electrode 4B is located inside the side face 2a of the laminate body 2. This arrangement causes parts of the internal electrodes 4A, 4B to overlap each other in the laminate direction (vertical direction) of the laminate body 2.

In the laminate body 2, the portions where the internal electrodes 4A, 4B overlap in the laminate direction constitute an active portion P in which the piezoelectric bodies 3 are displaced with application of a voltage to the internal electrodes 4A, 4B. In the laminate body 2, the portions where the internal electrodes 4A, 4B do not overlap in the laminate direction (i.e., the two side ends of the laminate body 2) constitute inactive portions Q in which the piezoelectric bodies 3 are not displaced with application of the voltage to the internal electrodes 4A, 4B.

In the inactive portions Q of the laminate body 2 there are a plurality of metal oxide layers 5 formed as electric insulating layers with the density (strength) lower than the piezoelectric bodies 3. Each metal oxide layer 5 is formed in the same layer as the internal electrode 4A, 4B. The thickness of the metal oxide layer 5 is approximately equal to the thickness of the internal electrode 4A, 4B. One end of each metal oxide layer 5 located in the same layer as the internal electrode 4A is in contact with the internal electrode 4A, and the other end of the metal oxide layer 5 is exposed in the side face 2b of the laminate body 2. One end of each metal oxide layer 5 located in the same layer as internal electrode 4B is in contact with the internal electrode 4B, and the other end of the metal oxide layer 5 is exposed in the side face 2a of the laminate body 2.

The metal oxide layers 5 are made of a material which has the melting point higher than the sintering temperature of PZT being the principal ingredient of the piezoelectric bodies 3 and which is soluble in PZT. Such materials include materials containing at least one of $ZrO_2$, $MgO$, $Nb_2O_5$, $Ta_2O_5$, $CeO_2$, and $Y_2O_3$. The metal oxide layers 5 and the piezoelectric bodies 3 are made of their respective materials of mutually different composition systems. The melting points of $ZrO_2$, $MgO$, $Nb_2O_5$, $Ta_2O_5$, $CeO_2$, and $Y_2O_3$ are approximately 1500-2800° C.

An external electrode 6A electrically connected to each internal electrode 4A is fixed to the side face 2a of the laminate body 2. An external electrode 6B electrically connected to each internal electrode 4B is fixed to the side face 2b of laminate body 2.

Each external electrode 6A, 6B has an electrode portion 7a, 7b of rectangular plate shape and a corrugated electrode portion 8a, 8b. The electrode portions 7a, 7b extend in the laminate direction of the laminate body 2 so as to cover the center region of the side faces 2a, 2b, respectively, of the laminate body 2. The electrode portions 8a, 8b are located outside the electrode portions 7a, 7b, respectively, and extend in the laminate direction of the laminate body 2. Each electrode portion 8a, 8b is bonded to the corresponding electrode portion 7a, 7b, respectively, so as to have a stretch property (flexibility) in the laminate direction of the laminate body 2. The electrode portions 7a, 7b are made, for example, of an electroconductive material whose principal ingredient is any one of Ag, Au, and Cu. The electrode portions 8a, 8b are made, for example, of Cu, a Cu alloy, Ni, an Ni alloy, a flexible board, or the like.

Figure 4:
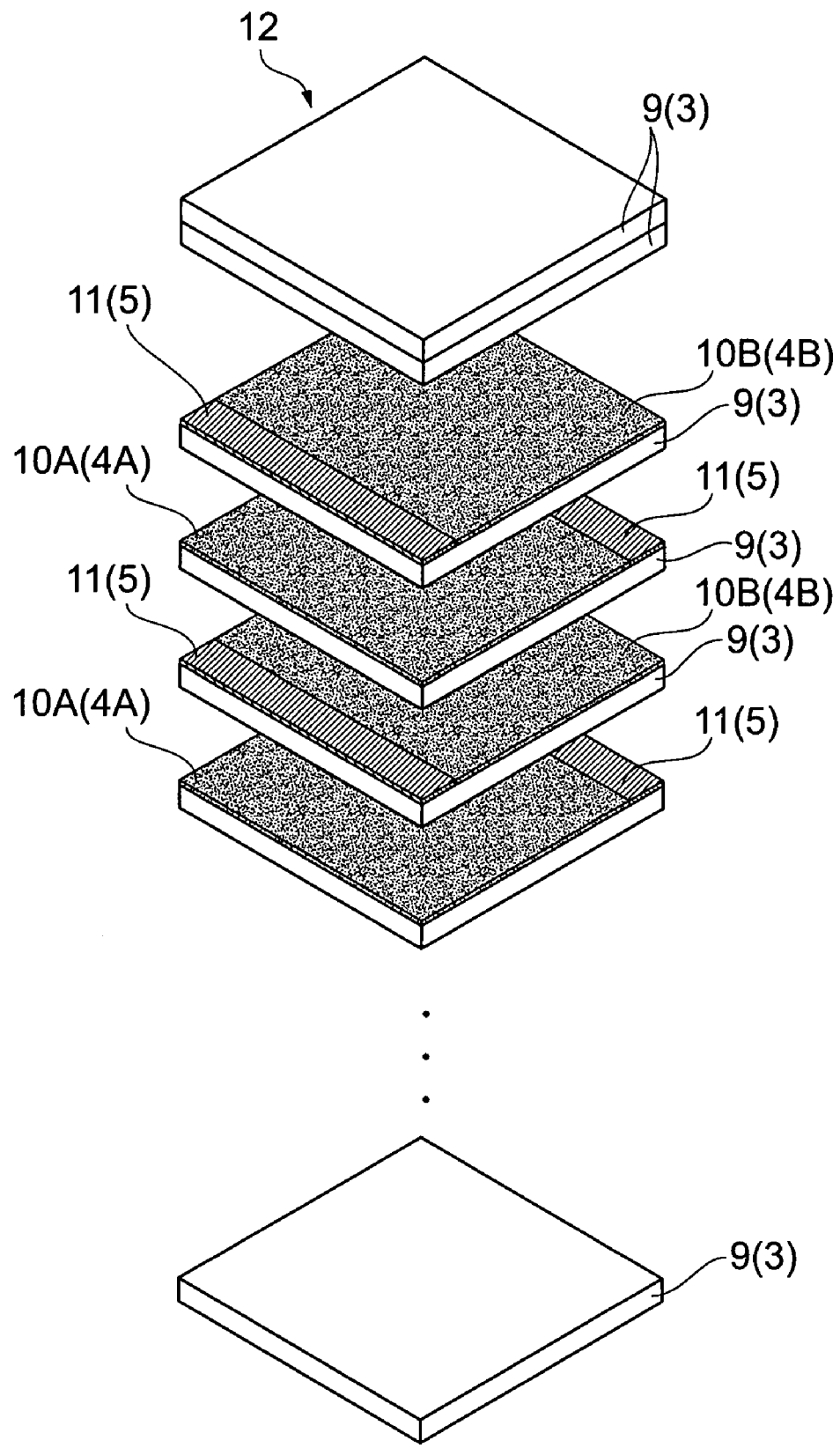
FIG. 4 is an exploded perspective view of a green laminate body fabricated in production of the multilayer piezoelectric element shown in FIG. 1.

A method of producing the above-described multilayer piezoelectric element 1 will be described below with reference to FIG. 4. In the same drawing, first, an organic binder resin, an organic solvent, etc. are mixed in a ceramic powder whose principal ingredient is PZT, to prepare a paste for green sheets. Then the paste for green sheets is applied onto a carrier film (not shown), for example, by the doctor blade method to form a plurality of green sheets 9 for formation of the aforementioned piezoelectric bodies 3.

Subsequently, an organic binder resin, an organic solvent, etc. are mixed in an electroconductive material to prepare a paste for electrode patterns. The electroconductive material contains Ag and Pd and, for example, can be constructed at the ratio of Ag:Pd=85:15. Then the paste for electrode patterns is printed on the green sheets 9, for example, by screen printing, whereby electrode patterns 10A, 10B corresponding to the aforementioned internal electrodes 4A, 4B are formed on individual green sheets 9. At this time, the electrode patterns 10A, 10B are printed in regions except for one-end-side portions corresponding to the inactive portions Q on the upper surfaces of the green sheets 9.

Furthermore, an organic binder resin, an organic solvent, etc. are mixed, for example, in a ceramic powder containing $ZrO_2$, to prepare a $ZrO_2$ paste. Particle sizes of the $ZrO_2$ powder to be used are preferably larger than those of the piezoelectric material powder. Then the $ZrO_2$ paste is printed, for example, by screen printing, on regions (one-end-side portions corresponding to the inactive portions Q) without print of the electrode pattern 10A or the electrode pattern 10B on the upper surfaces of the green sheets 9, to form $ZrO_2$ paste layers 11. At this time, the $ZrO_2$ paste is preferably printed so that each $ZrO_2$ paste layer 11 becomes flush with the electrode pattern 10A, 10B.

Subsequently, the green sheets 9 with the electrode pattern 10A and $ZrO_2$ paste layer 11, and the green sheets 9 with the electrode pattern 10B and $ZrO_2$ paste layer 11 are laminated in a predetermined order. Furthermore, a predetermined number of green sheets 9 without electrode patterns 10A, 10B nor $ZrO_2$ paste layer 11 are laminated as protecting layers in the outermost layers. This forms a green laminate body 12.

Subsequently, the green laminate body 12 is pressed in the laminate direction while being heated at the temperature of about 60° C. Thereafter, the green laminate body 12 is cut in a predetermined size, for example, with a diamond blade to obtain a chip. This causes the electrode patterns 10A, 10B and the $ZrO_2$ paste layers 11 to be exposed in the side faces of the green laminate body 12, as shown in FIG. 4.

Then the green laminate body 12 after cut is mounted on a setter (not shown) and a degreasing (debinding) process of the green laminate body 12 is carried out at the temperature of about 400° C. for about ten hours. Then the degreased green laminate body 12 is put in a sagger furnace and the green laminate body 12 is fired, for example, at the temperature of 950-1000° C. for about two hours. This results in sintering the green sheets 9, electrode patterns 10A, 10B, and $ZrO_2$ paste layers 11 and obtaining the laminate body 2 as a sintered body.

At this time, since the $ZrO_2$ paste layers 11 are made of the material of the composition system different from that of the green sheets 9, sintering reactivity is suppressed between the $ZrO_2$ paste layers 11 and the green sheets 9, without occurrence of unwanted chemical reaction between them. In addition, since the melting point of the $ZrO_2$ paste layers 11 is higher than the sintering temperature of the green sheets 9, the $ZrO_2$ paste layers 11 are less likely to be sintered than the green sheets 9. For this reason, after the sintering step, the $ZrO_2$ paste layers 11 become the metal oxide layers 5 with low bond strength to the piezoelectric bodies 3.

Since each $ZrO_2$ paste layer 11 is formed so as to be flush with the electrode pattern 10A, 10B, it is feasible to prevent occurrence of strain in the green laminate body 12 due to a level difference between the $ZrO_2$ paste layer 11 and the electrode pattern 10A, 10B.

Next, the external electrodes 6A, 6B are formed on the side faces 2a, 2b, respectively, of the laminate body 2. Specifically, for example, an electroconductive paste whose principal ingredient is Ag is printed by screen printing on the side faces 2a, 2b of the laminate body 2 and a baking treatment is carried out, for example, at the temperature of about 700° C. to form the electrode portions 7a, 7b on the side faces 2a, 2b, respectively, of the laminate body 2. The electrode portions 7a, 7b may also be formed by any other method such as sputtering or electroless plating. Then the corrugated electrode portions 8a, 8b are bonded to the respective electrode portions 7a, 7b, for example, by soldering.

Finally, a polarization process is carried out by applying a predetermined voltage, for example, at the temperature of 120° C., for example, for three minutes so that the intensity of the electric field in the thickness direction of the piezoelectric bodies 3 becomes about 2 kV/mm. At this time, stress is concentrated on the inactive portions Q of the laminate body 2, but the stress on the inactive portions Q is relaxed by the metal oxide layers 5 because the plurality of metal oxide layers 5 are formed in the inactive portions Q. Therefore, cracks or the like extending in the laminate direction of the laminate body 2 become less likely to occur. The above completes the multilayer piezoelectric element 1 as shown in FIGS. 1 to 3.

In the multilayer piezoelectric element 1 produced in this manner, when a voltage is applied between the external electrodes 6A, 6B, the voltage is applied between the internal electrodes 4A, 4B connected to the external electrodes 6A, 6B, to produce an electric field between them and displace the piezoelectric bodies 3 in the active portion P of the laminate body 2 in the laminate direction of the laminate body 2. At this time, stress is also concentrated on the inactive portions Q of the laminate body 2, but the metal oxide layers 5 relax the stress on the inactive portions Q as described above. In this case, therefore, the cracks or the like extending in the laminate direction of the laminate body 2 also become less likely to occur.

Incidentally, if the material for making up the metal oxide layers 5 is a material that reacts with the Pb-based material to form a liquid phase, e.g., like $Al_2O_3$, $SiO_2$, or $P_2O_5$, these materials are not dissolved in PZT and are likely to form grain boundaries. Therefore, for example, when the green laminate body including $Al_2O_3$ paste layers is fired, $Al_2O_3$ separates out in grain boundaries of the green sheets 9. For this reason, it impedes growth of particles of PZT and increases the number of grain boundaries per unit thickness in the green sheets 9. In this case, when the voltage is applied between the external electrodes 6A, 6B to apply the electric field between the internal electrodes 4A, 4B in the multilayer piezoelectric element after produced, thermal loss occurs because of the grain boundaries of the piezoelectric bodies 3. This will result in failing to achieve sufficient displacement of the piezoelectric bodies 3 against the applied electric field and lead to degradation of the piezoelectric property.

In contrast to it, the present embodiment uses the material to be soluble in PZT, such as $ZrO_2$, $MgO$, $Nb_2O_5$, $Ta_2O_5$, $CeO_2$, or $Y_2O_3$, as the material for making up the metal oxide layers 5. For this reason, the component such as $ZrO_2$ does not separate out in the grain boundaries of the green sheets 9 during the firing of the green laminate body 12, and this suppresses increase in the number of grain boundaries per unit thickness in the green sheets 9. Therefore, the thermal loss due to grain boundaries in the piezoelectric bodies 3 is reduced when the voltage is applied between the external electrodes 6A, 6B to apply the electric field between the internal electrodes 4A, 4B in the multilayer piezoelectric element 1 after produced. This results in achieving sufficient displacement of the piezoelectric bodies 3 against the applied electric field and thus ensuring a desired piezoelectric property.

Since increase in the number of grain boundaries per unit thickness is suppressed in the piezoelectric bodies 3, the cracks or the like extending in the laminate direction of the laminate body 2 become less likely to occur.

As described above, the present embodiment is able to prevent the occurrence of the cracks or the like extending in the laminate direction of the laminate body 2 during the polarization process and during the driving of the multilayer piezoelectric element 1, without degradation of the desired piezoelectric property of the multilayer piezoelectric element 1. This prevents a short circuit between the internal electrodes 4A, 4B and avoids dielectric breakdown of the multilayer piezoelectric element 1. As a result, it becomes feasible to improve the quality of the multilayer piezoelectric element 1.

Figure 5:
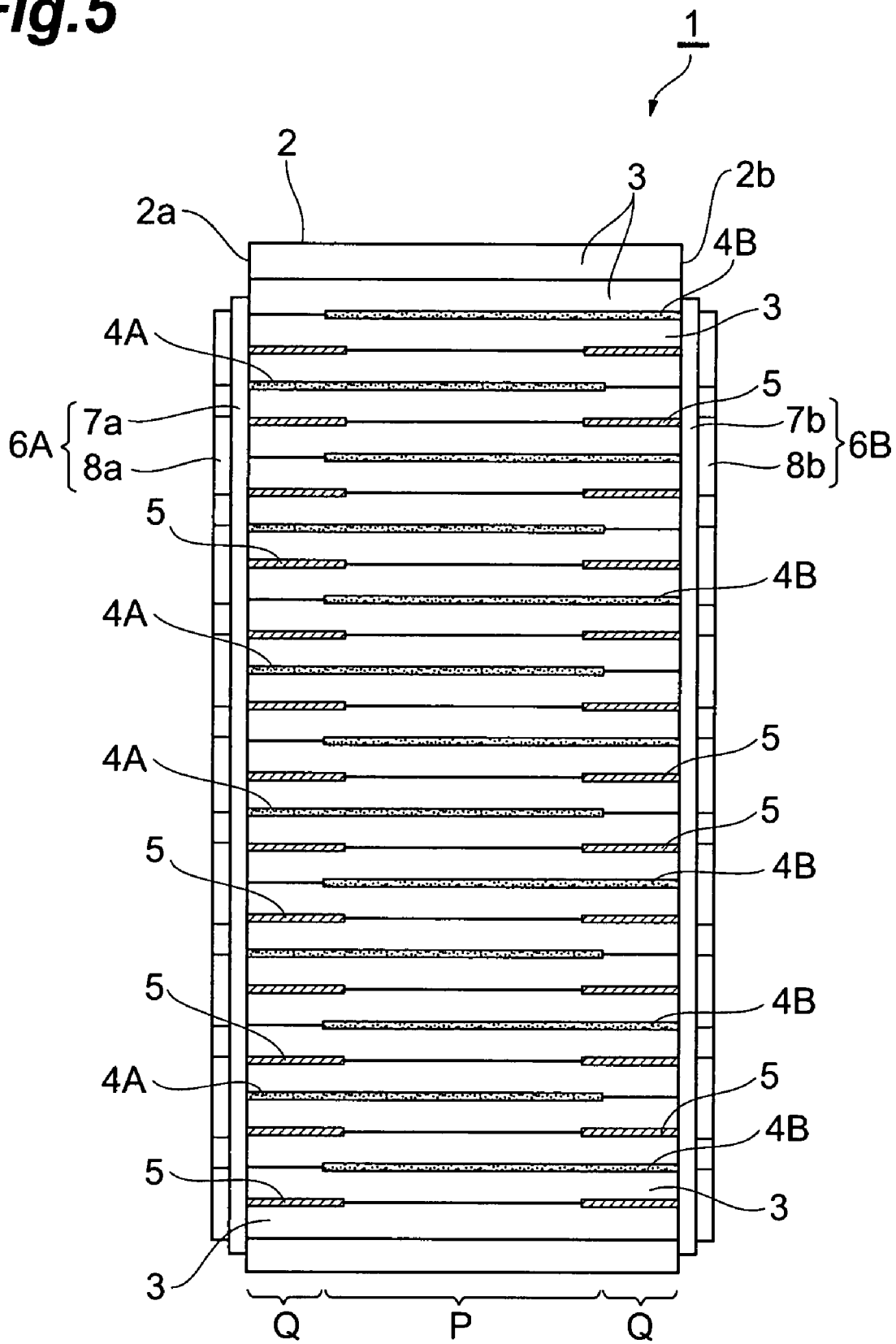
FIG. 5 is a side view showing a multilayer piezoelectric element according to the second embodiment.
Figure 6:
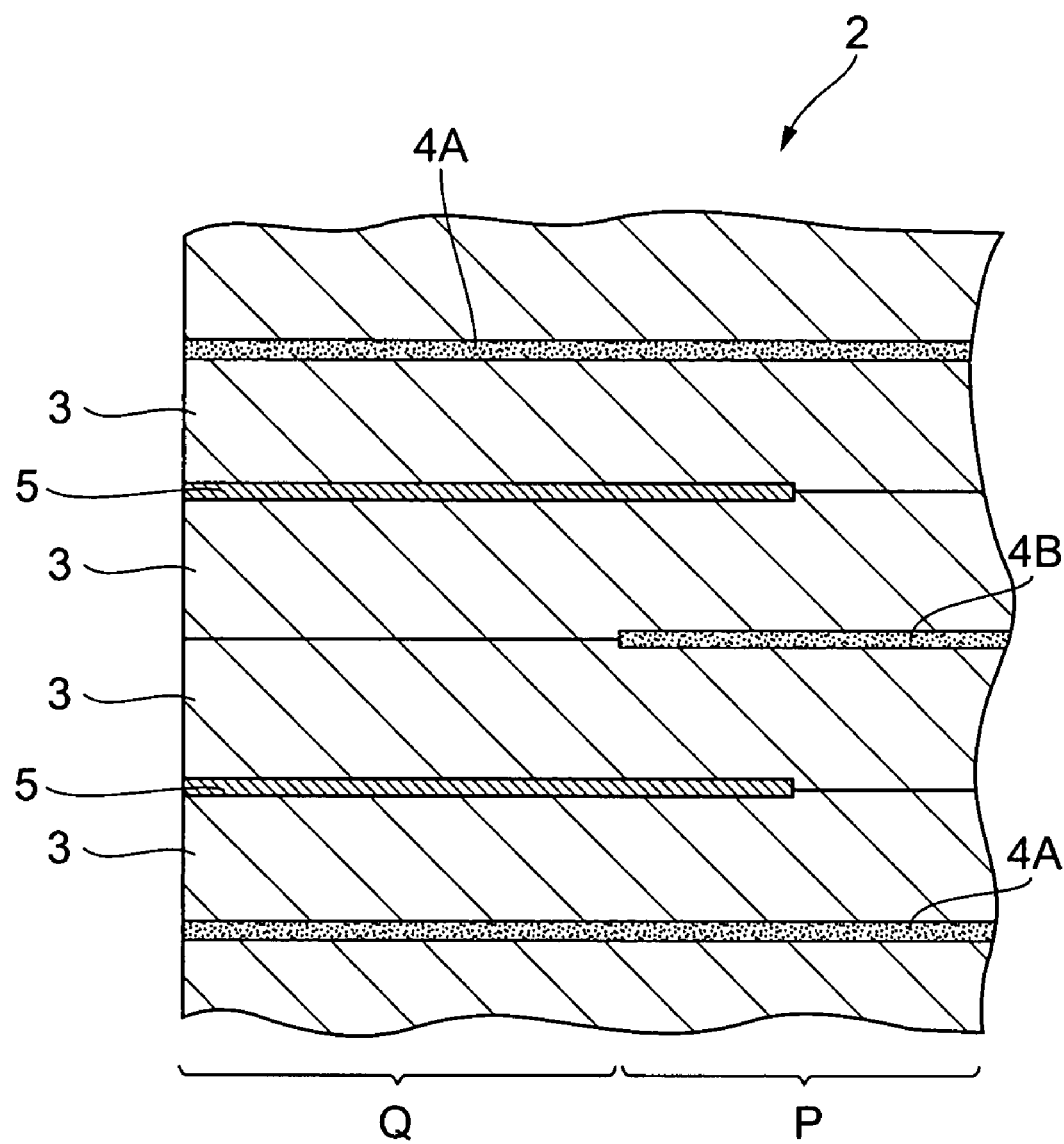
FIG. 6 is a partly enlarged sectional view showing a layer structure of the multilayer piezoelectric element shown in FIG. 5.

FIG. 5 is a side view of the multilayer piezoelectric element according to the second embodiment, and FIG. 6 a partly enlarged side view showing the layer structure of the multilayer piezoelectric element shown in FIG. 5. In the drawings, identical or equivalent elements to those in the first embodiment are denoted by the same reference symbols, without redundant description.

In each drawing, the multilayer piezoelectric element 1 of the present embodiment has the laminate body 2 including the piezoelectric bodies 3, internal electrodes 4A, 4B, and metal oxide layers 5, as in the first embodiment. The metal oxide layers 5 are formed in a layer between adjacent internal electrodes 4A, 4B in the laminate direction of the laminate body 2, in the inactive portions Q of the laminate body 2. Each metal oxide layer 5 is formed so as to slightly penetrate the active portion P from the inactive portion Q of the laminate body 2.

Figure 7:
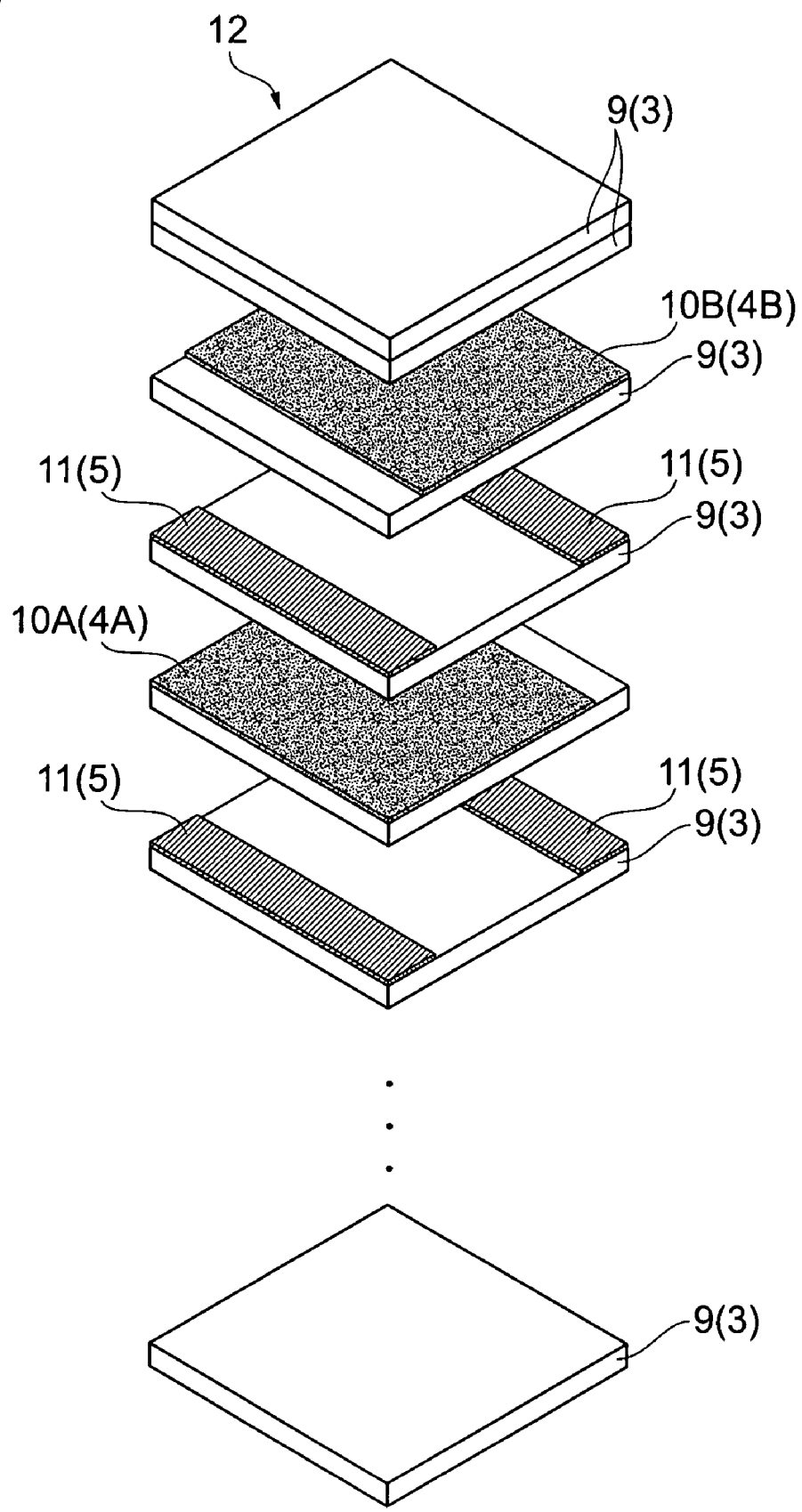
FIG. 7 is an exploded perspective view of a green laminate body fabricated in production of the multilayer piezoelectric element shown in FIG. 5.

For producing the multilayer piezoelectric element 1 of this configuration, as shown in FIG. 7, a plurality of green sheets 9 are formed and electrode patterns 10A, 10B are formed on respective individual green sheets 9, as in the first embodiment. The $ZrO_2$ paste layers 11 are formed in two end portions (portions including the region corresponding to the inactive portions Q and a part of the regions corresponding to the active portion P) of green sheets 9 different from the green sheets 9 on which the electrode pattern 10A or the electrode pattern 10B is formed.

After the electrode patterns 10A, 10B and the $ZrO_2$ paste layers 11 are formed, the green sheets 9 with the electrode pattern 10A, the green sheets 9 with the electrode pattern 10B, and the green sheets 9 with the $ZrO_2$ paste layers 11 are laminated in a predetermined order. Green sheets 9 without the electrode patterns 10A, 10B and $ZrO_2$ paste layers 11 are laminated as protecting layers in the outermost layers. This forms a green laminate body 12.

Thereafter, pressing, cutting, degreasing (debindering), and firing are carried out in the same manner as in the first embodiment, to obtain the laminate body 2. The external electrodes 6A, 6B are provided on the side faces 2a, 2b of the laminate body 2 and the polarization process is finally carried out, thereby completing the multilayer piezoelectric element 1 as shown in FIGS. 5 and 6.

The multilayer piezoelectric element 1 of the present embodiment is also able to prevent the occurrence of the cracks or the like extending in the laminate direction of the laminate body 2, without degradation of the desired piezoelectric property. Since the metal oxide layers 5 are formed so as to penetrate the region of the active portion P from the inactive portions Q, even if a crack or the like is made in the active portion P of the laminate body 2, the crack or the like tends to extend along the metal oxide layer 5 and in a direction (lateral direction) perpendicular to the laminate direction of the laminate body. This successfully prevents the occurrence of cracks or the like extending in the laminate direction of the laminate body 2, more surely.

Figure 8:
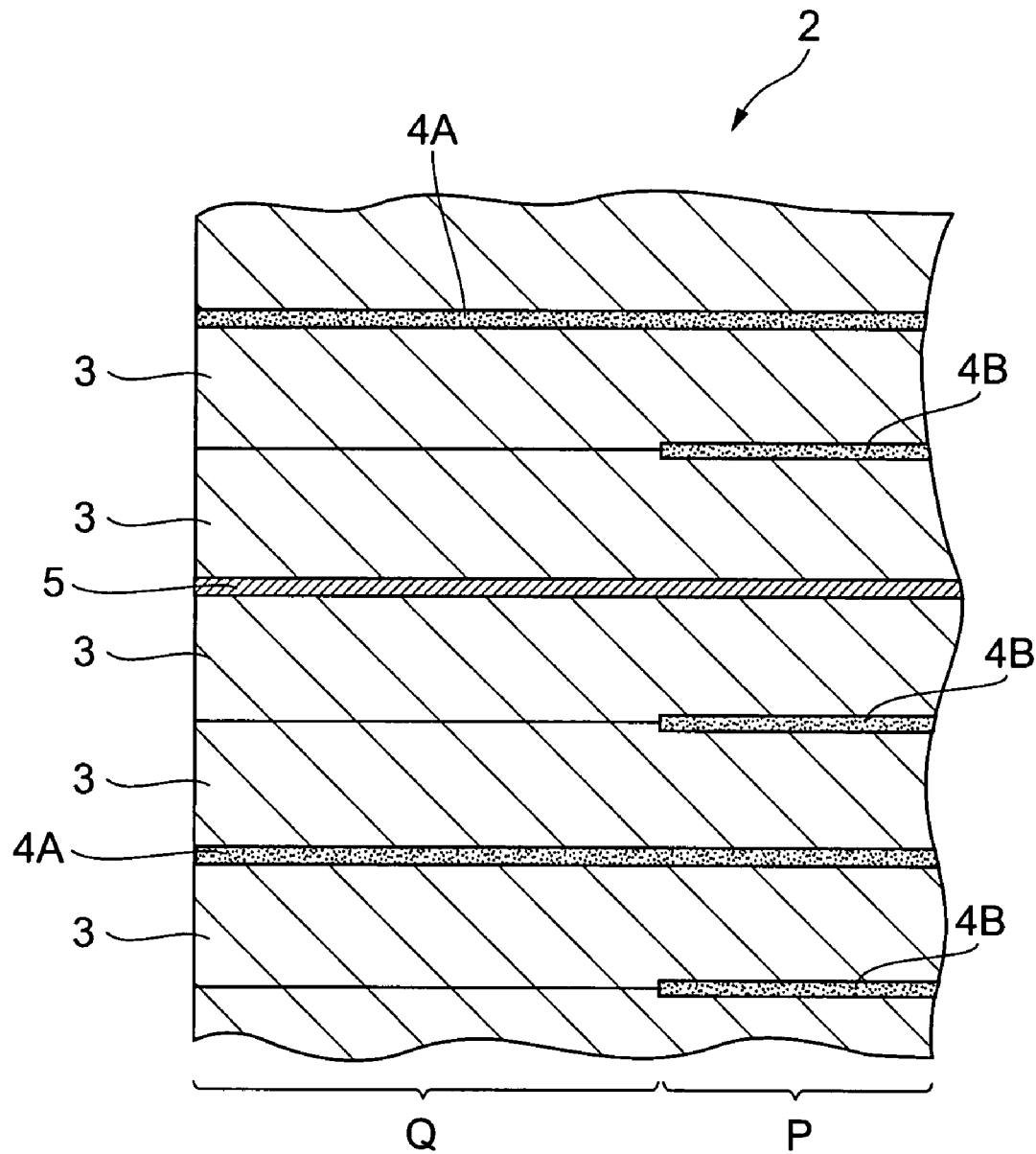
FIG. 8 is a partly enlarged sectional view showing a modification example of the layer structure of the laminate body.

It is noted that the present invention is by no means limited to the above embodiments. For example, a variety of modifications can be made as to the layer structure of the laminate body 2. As an example, as shown in FIG. 8, the metal oxide layers 5 may be provided each between internal electrodes 4A, 4A or between internal electrodes 4B, 4B adjacent in the laminate direction of the laminate body 2. It is also possible to adopt a configuration wherein the metal oxide layers 5 are provided each entirely through the layer from the side face 2a to the side face 2b of the laminate body 2 between internal electrodes adjacent in the laminate direction of the laminate body 2.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer piezoelectric element comprising a laminate body in which a plurality of piezoelectric bodies and a plurality of internal electrodes are alternately laminated and simultaneously sintered, wherein the plurality of internal electrodes comprise a first electrode and a second electrode, wherein the laminate body has:

an active portion in which the first electrode and the second electrode are arranged to overlap in a laminate direction of the laminate body; and inactive portions which are provided on both sides of the active portion and in which the first electrode and the second electrode are arranged not to overlap in the laminate direction of the laminate body, wherein the inactive portions are provided with a metal oxide layer formed of a material having a melting point higher than a sintering temperature of the piezoelectric bodies and being soluble in the piezoelectric bodies, the metal oxide layer being laminated in, and in parallel with, the plurality of piezoelectric bodies, the metal oxide layer extending in both at least a part of the active portion and at least a part of the inactive portions, and the metal oxide layer overlapping, in the laminate direction, both at least a part of the first electrode and a part of the second electrode, and wherein the metal oxide layer is simultaneously sintered with the plurality of piezoelectric bodies.

2. The multilayer piezoelectric element according to claim 1, wherein the piezoelectric bodies are formed of a piezoelectric material whose principal ingredient is lead zirconate titanate, and wherein the metal oxide layer is formed of a material containing at least one of $ZrO_2$, $MgO$, $Nb_2O_5$, $Ta_2O_5$, $CeO_2$, and $Y_2O_3$.

3. The multilayer piezoelectric element according to claim 1, wherein the metal oxide layer is formed in the same layer as the internal electrode.

4. The multilayer piezoelectric element according to claim 1, wherein the metal oxide layer is formed so as to penetrate the active portion in a layer between the first electrode and the second electrode.

5. The multilayer piezoelectric element according to claim 1, wherein a metal component of the internal electrodes is different from a metal component of the metal oxide layer.

* * * * *